United States Patent [19]

Cobaugh et al.

[11] 4,349,237
[45] Sep. 14, 1982

[54] GUIDE SYSTEM FOR CARD EDGE CONNECTORS

[75] Inventors: Robert F. Cobaugh, Elizabethtown; Norwood C. Graeff, Harrisburg, both of Pa.

[73] Assignee: AMP Incorporated, Harrisburg, Pa.

[21] Appl. No.: 172,334

[22] Filed: Jul. 25, 1980

[51] Int. Cl.[3] .......................... H01R 13/20; H05K 7/14
[52] U.S. Cl. ............................. 339/65; 339/17 LM; 361/415
[58] Field of Search ........ 339/17 L, 17 LM, 176 MP, 339/75 MP, 91 R, 17 M, 65; 361/415; 211/41, 89, 121

[56] References Cited

U.S. PATENT DOCUMENTS

| | | | |
|---|---|---|---|
| 3,518,610 | 6/1970 | Goodman et al. | 339/176 MP X |
| 3,567,998 | 3/1971 | Ammerman | 339/17 L X |
| 3,737,838 | 6/1973 | Mattingly, Jr. | 339/17 L X |
| 3,905,665 | 9/1975 | Lynch et al. | 339/17 L |
| 3,932,016 | 1/1976 | Ammenhauser | 339/75 MP X |
| 4,087,148 | 5/1978 | Bauerle | 339/176 MPX |
| 4,129,351 | 12/1978 | Sugimoto et al. | 339/91 R X |
| 4,133,592 | 1/1979 | Cobaugh et al. | 339/17 M |
| 4,134,632 | 1/1979 | Lindberg | 339/176 MP X |

Primary Examiner—Joseph H. McGlynn
Assistant Examiner—John S. Brown
Attorney, Agent, or Firm—Allan B. Osborne

[57] ABSTRACT

The present invention relates to a connector into which a printed circuit board or card may be inserted and card guides associated with the connectors which guide and support the inserted card. More particularly, the connector consists of two housings having a common center card-receiving slot with terminals lining the walls thereof. Pins on the terminals pass through the base of the housings for insertion into a printed circuit mother board or the like. The guides have slots into which the edges of the printed circuit board slide. A flexible latch on the guides lock the boards against inadvertant movement.

1 Claim, 8 Drawing Figures

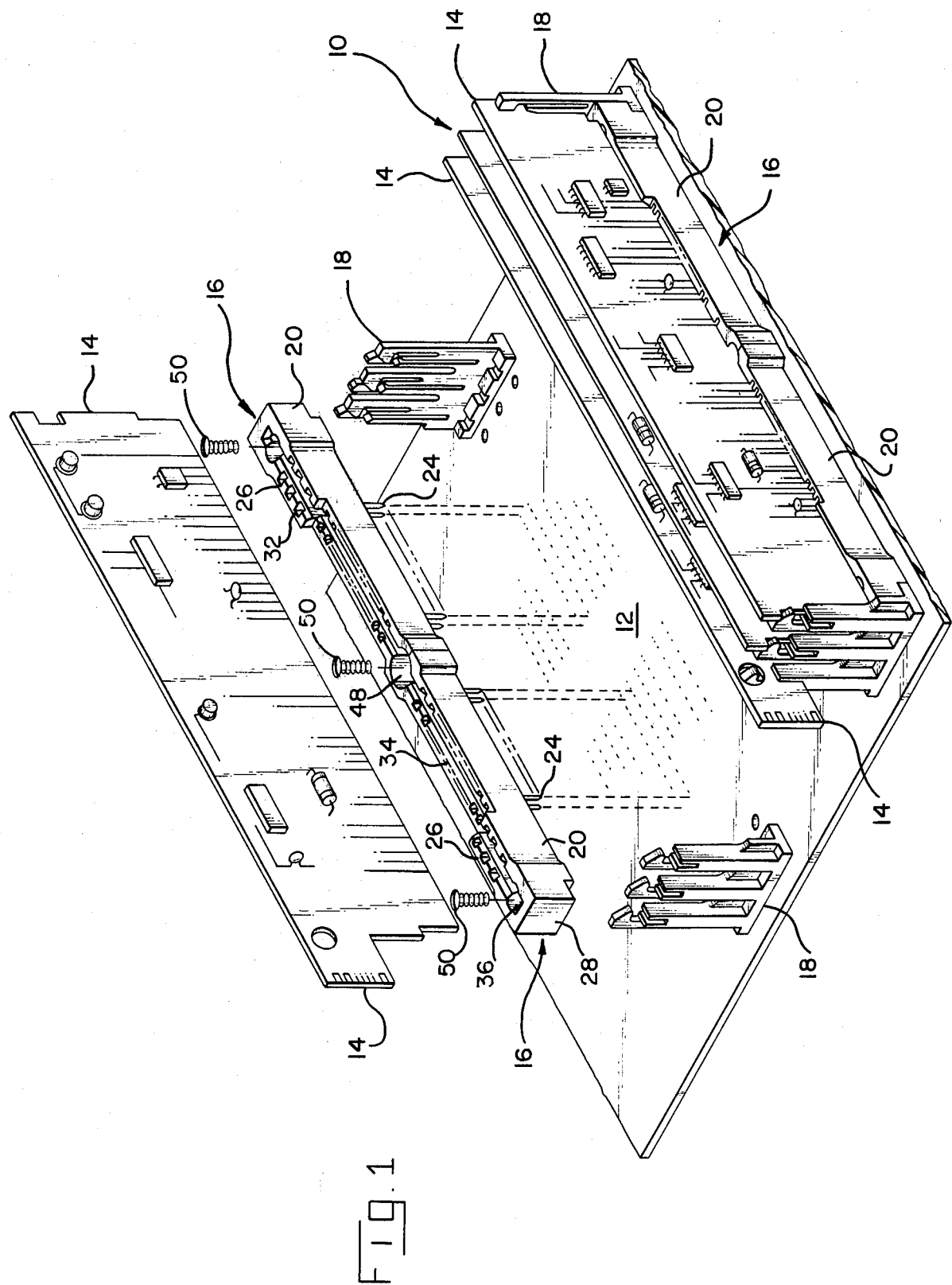

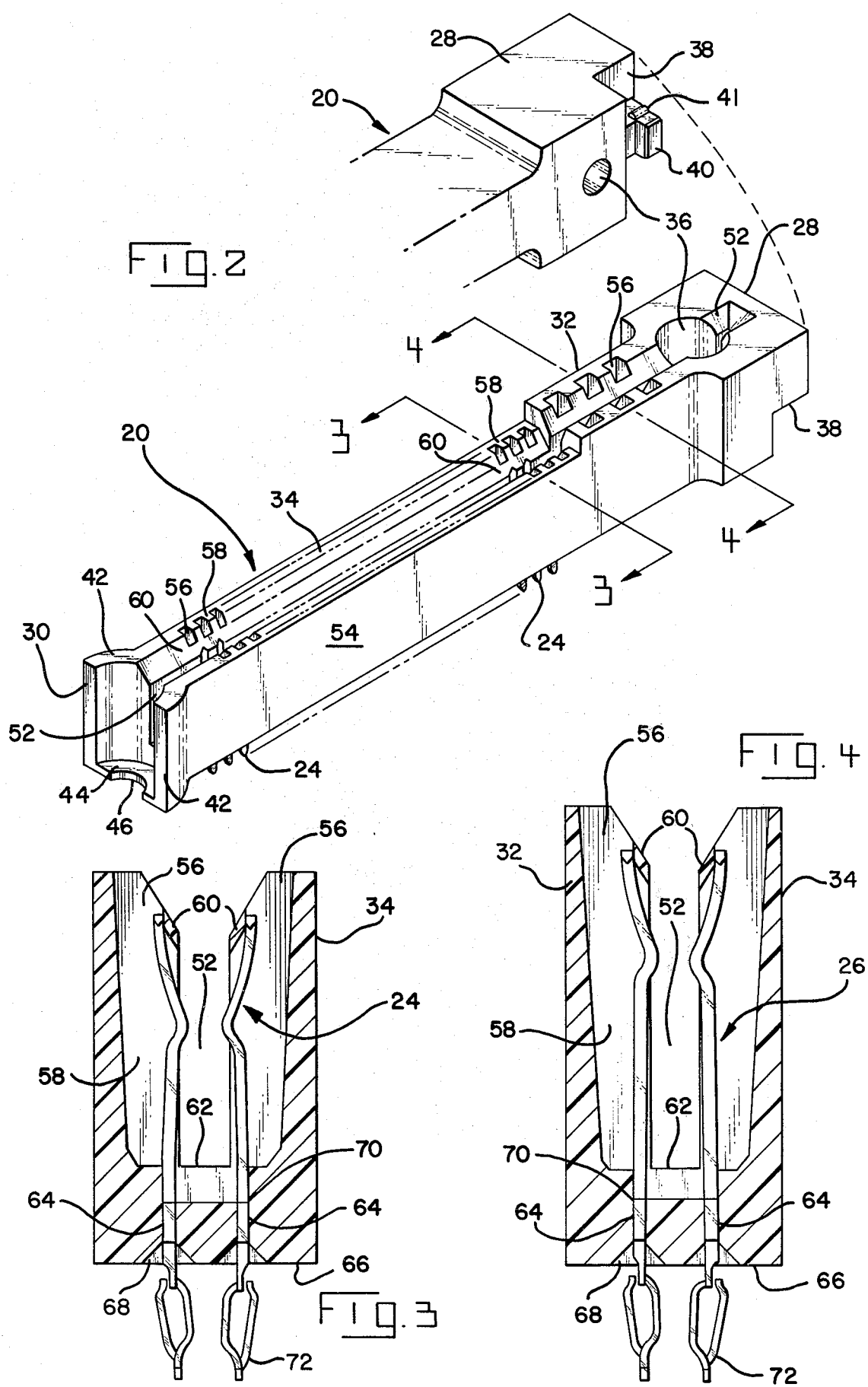

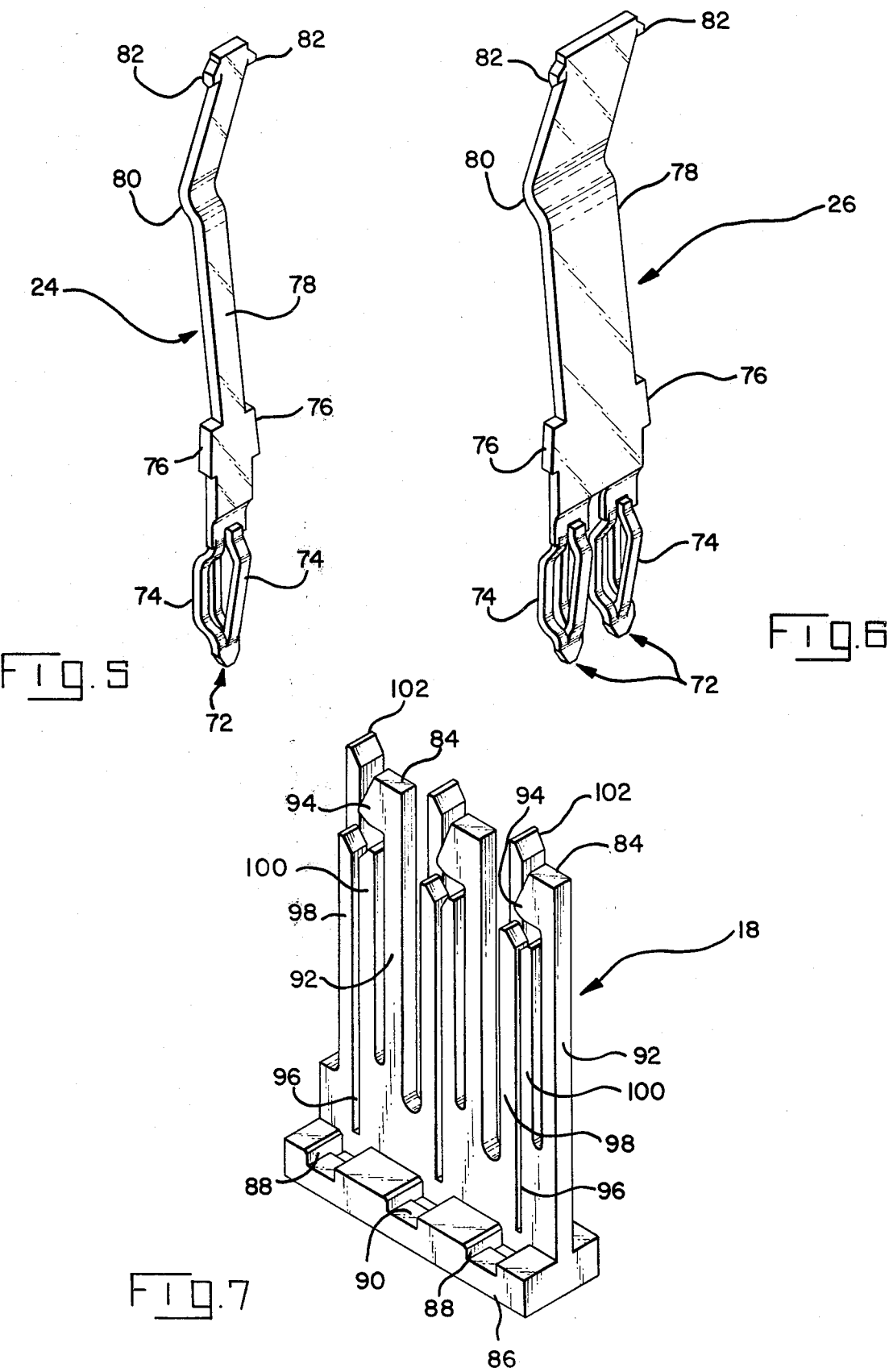

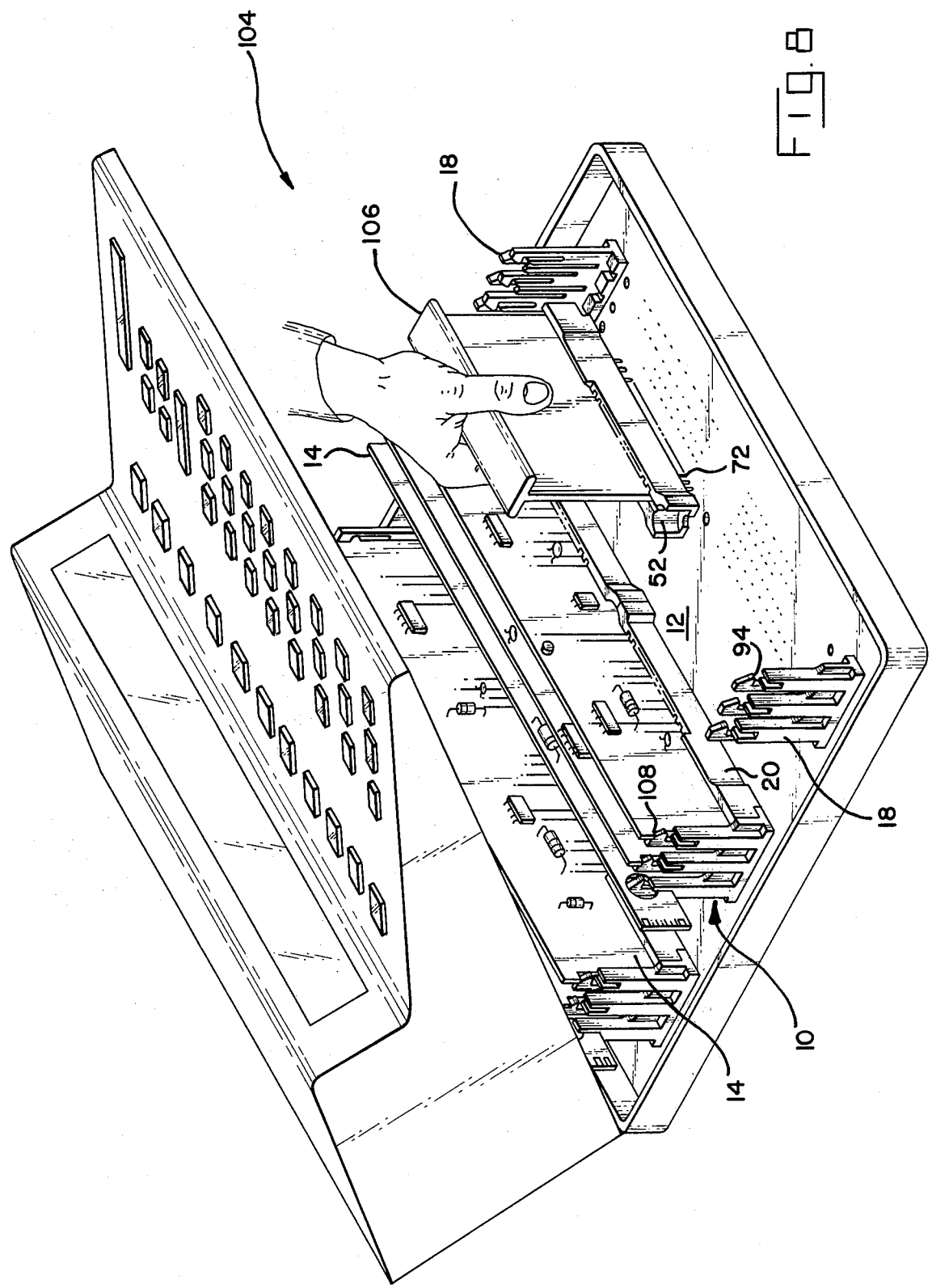

GUIDE SYSTEM FOR CARD EDGE CONNECTORS

BACKGROUND OF THE INVENTION

1. The Field of the Invention

This invention relates to connectors which are mounted on a major or so-called printed circuit mother board and which receive and electrical connect circuits on minor or so-called printed circuit daughter boards. The invention also relates to guides associated with the connector for guiding and retaining the daughter boards into the connector.

2. The Prior Art

A typical prior art device is disclosed in U.S. Pat. No. 3,905,665. In one embodiment disclosed, a housing of insulating material provides a shroud for a double row of terminals independently mounted on a printed circuit board. Further, vertically projecting card guides are located at each end of the housing. The guides have channels therein which are in registration with the card-receiving channel in the top of the housing. Although the guides are an integral part of the housing, the connection therebetween is narrow so that the guides have some resiliency.

An alternative embodiment disclosed is one wherein the terminals are fixed in the housing.

SUMMARY OF THE INVENTION

The present invention relates to a system consisting of a two part, card-receiving connector and card guides for guiding cards into the connector. Two identical housings are joined together to form the connector. Each housing contains signal and power terminals. The card guides include a flexible latch and guide slots. The system incorporates a card guide at each end of the connector.

BRIEF DESCRIPTION OF THE DRAWINGS

FIG. 1 illustrates the connectors and guide system of the present invention in relation to a mother board and cards;

FIG. 2 is a perspective view of the housing of the connector of FIG. 1;

FIGS. 3 and 4 are cross-sectional views of the housing of FIG. 2 taken along lines 3—3 and 4—4, respectively, showing the signal and power terminals therein;

FIGS. 5 and 6 are perspective views of the signal and power terminals;

FIG. 7 is a perspective view of a card guide; and

FIG. 8 illustrates a typical utilization of the connector and guide system of the present invention.

DESCRIPTION OF THE INVENTION

One complete connector and guide system 10 of the present invention is shown in FIG. 1 mounted on a printed circuit mother board 12. A partially completed system is also shown to demonstrate the mounting technique as well as to identify the components of a system 10. Printed circuit daughter boards, herein after referred to as cards 14, are electrically connected to the mother board by the system.

The components of system 10 include a one to three, two part connectors 16 and two guides 18, one on each end.

A connector 16 includes two housings 20, signal terminals 24, and power terminals 26. The two housings are structurally and functionally identical. One, elongated housing; i.e., a single structure, could be used in the same manner as the two discrete housings. However, as this system is designed to be implemented in the field; i.e., a store, hotel and so forth, the forces required to insert the housing onto board 12 must be within the limited capability available. Two smaller housings meet this requirement.

FIG. 2 shows a housing 20 in greater detail. FIG. 3 is a cross-sectional view of the section of the housing containing signal terminals 24. FIG. 4 is a cross-sectional view of the section of the housing containing power terminals 26.

Returning to FIG. 2, the outer end of housing 20 is indicated by reference numeral 28 and the inner end by reference numeral 30. Between the two ends is power terminal section 32, adjacent to outer end 28, and signal terminal section 34, positioned between section 32 and inner end 30.

Outer end 28 has opening 36 therethrough. A screw may be positioned in the opening to secure the housing to the board. The free end is undercut to provide a downwardly facing shoulder 38. FIG. 2 also shows the underside of the outer end and the shoulder 38. A stepped or L-shaped stud 40 extends downwardly from the shoulder. Dimples 41 are located on each side of the stud.

Inner end 30 consists of two curved walls 42 and floor 44. A semi-circular cut-out 46 is provided in the floor. As seen in FIG. 1, the two housings join at their inner ends and the curved walls define screw receiving cavity 48. The cut-outs define a center opening (not shown) for screw 50.

A card receiving slot 52 runs down the length of the housing, opening into inner end 30 and terminating beyond opening 36 in the outer end. The slot defines two side walls 54 in which there are a number of terminal receiving cells 56. The cells in one side wall are in direct alignment with the cells in the opposing side wall. With reference to FIGS. 3 and 4, the structure of cells 56 are shown. As can be seen, the structure of the cells in section 32 is the same as the cells in section 34 except for height and width. Each cell is isolated from its neighbor by a lateral wall 58. The cells are open at the top and also open into slot 52 below retaining bar 60 which crosses each cell horizontally at the juncture between the open top and open side. The floor of slot 52 is indicated by reference numeral 62.

A bore 64 connects each cell 56 to the underside 66 of the housing. The entrances on the underside to the bores is preferably chamfered as indicated by reference numeral 68. The width of the bore is reduced symmetrically; i.e., inwardly from both sides (not shown) so that there are two downwardly facing shoulders 70 per bore (only one of which is shown).

The terminals 24 and 26 that are loaded in cells 56/bores 64 are illustrated in FIGS. 5 and 6. Signal terminal 24, FIG. 5, has a pin 72 on its lower end that is adapted for insertion into and removal from a plated through hole (not shown) in mother board 12. The pin has three bowed out spring members 74 which provide retension in and good electrical contact with the wall of the plated-through holes. The pin may also be formed with only two spring members (not shown).

A pair of tabs 76, one on either side are provided just above pin 72. The tabs retain the terminal in the housing by an interference fit.

The medial portion 78 of the terminal is formed into a generally concave-convex shape. The convex surface forms a contact surface indicated by reference numeral 80 and may be selectively plated with gold or other desirable plating materials.

Two small ears 82 project out from the sides of the terminal at the top thereof. The function or purpose for the ears are to center the terminal in the cell.

Power terminal 26 is similar to signal terminal 24 but of a larger size to accommodate larger currents. Other than the size and the presence of two pins 72, terminal 26 has identical features as terminal 24.

The terminals are loaded into the cells from below. The top of ears 76 abut shoulders 70 in the bores to position the terminal. The top of the terminals, indicated by reference numeral 83, are located behind retaining bar 60. Contact surfaces 80 project into slot 52 to engage the traces or circuits on the cards.

A card guide 18 is illustrated in FIG. 7. The guide shown has three units 84 with each unit capable of accepting one card; i.e., the edge of the card. A card guide may be made with one or more units as required.

Guide 18 includes a base 86 on which the units are supported. Conventional means such as bolts or screws may be used to secure the base to a board 12. However, in the disclosed embodiment the guides are held in place by the studs on the housings.

Notches 88 are provided in the base in front of each unit. The floor 90 of each notch is stepped to receive stud 40 on the outer end of housing 20. Dimples 41 wedge the stud into the notch for an interference fit.

Each unit includes a flexible latch 92. This member has a nose 94 on one side which enters an opening on the card to hold it in slot 96. This slot is defined by two spaced apart posts 98 and 100. Although the latch and post 100 join near base 86, the latch may be moved laterally.

The tops of posts 98 and 100 are beveled in to define a funnel entrance to slot 96.

A third post, indicated by reference numeral 102, extends upwardly from and is an offset continuation of post 98. The top of post 102 is also beveled and functions to guide the card towards slot 96 in cooperation with the beveled side of nose 94. As the card is pushed down, it cams latch 92 out of the way.

As shown in FIG. 1, a card guide 18 is positioned at each side of board 12.

FIG. 8 illustrates a typical use for the present invention. A machine 104 operates by means of the electronic components on daughter cards 14. The circuits on the cards are connected to mother board 12 through the connectors of the present invention.

The required number of card guides 18 are positioned on each side of the board. Housings 20, loaded with signal and power terminals are placed on the board with studs 40 being located in notches 90 as noted above. A T-shaped tool 106 is used to drive pins 72, depending from the housing, into plated-through holes on the board. This tool fits into card-receiving slot 52 and distributes the force being applied by hand across the housing uniformly. With both housings in place screws 50 secure them to the board and card guides.

A card 14 is inserted into the housings by aligning its edges with the card guides and pushing it down. With the edges in slots 96, the card is guided precisely into the card-receiving slots 52 of the joined housings. The latch 94 which had been cammed back, returns and the nose enters an opening 108 on the edges of the card.

The present invention may be subject to many changes and modifications without departing from the spirit or essential characteristics thereof. The present embodiments are therefore to be considered in all respects as illustrative and not restrictive of the scope of the invention.

What is claimed is:

1. A guide system for guiding cards into a card edge connector and for removably retaining them therein, said device comprising, a pair of card guides positioned on each end of a card edge connector, said guides including of a base extending upwardly therefrom a unit consisting of first and second, spaced apart posts defining therebetween a slot for receiving a side of a circuit card, a flexible latch member extending upwardly from the base along side the second post on the side opposite the slot and having a nose extending across the top of the second post and the slot, and further, a third post connected to and horizontally offset from the first post and extending upwardly therefrom, said third post being adapted, in cooperation with the nose on the latch member, to channel the card into the slot and the latch member being adapted to be resiliently cammed away from the slot to admit the card thereinto and to removably latch the card therein by the nose being received in an opening which may be in the card.

* * * * *